(12) United States Patent
Taylor et al.

(10) Patent No.: US 6,210,555 B1
(45) Date of Patent: Apr. 3, 2001

(54) ELECTRODEPOSITION OF METALS IN SMALL RECESSES FOR MANUFACTURE OF HIGH DENSITY INTERCONNECTS USING REVERSE PULSE PLATING

(75) Inventors: E. Jennings Taylor, Troy; Jenny J. Sun, Tipp City, both of OH (US); Chengdong Zhou, Salem, OR (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

(21) Appl. No.: 09/239,811

(22) Filed: Jan. 29, 1999

(51) Int. Cl.[7] .................................................. C25D 5/18
(52) U.S. Cl. ........................ 205/103; 205/105; 205/123
(58) Field of Search .................................. 205/103, 105, 205/123

(56) References Cited

U.S. PATENT DOCUMENTS 4,666,567 * 5/1987 Loch ..................................... 205/103
5,489,488 * 2/1996 Asai et al. ........................... 428/611
5,972,192 * 10/1999 Dubin et al. ......................... 205/101

* cited by examiner

*Primary Examiner*—Kathryn Gorgos
*Assistant Examiner*—Wesley A. Nicolas
(74) *Attorney, Agent, or Firm*—Vorys, Sater, Seymour and Pease LLP

(57) ABSTRACT

A layer of a metal is electroplated onto an electrically conducting substrate having a generally smooth surface with a small recess therein, having a transverse dimension not greater than about 350 micrometers, typically from about 5 micrometers to about 350 micrometers, by immersing the substrate and a counterelectrode in an electroplating bath of the metal to be electroplated and passing a modulated reversing electric current between the electrodes. The current contains pulses that are cathodic with respect to said substrate and pulses that are anodic with respect to said substrate. The cathodic pulses have a duty cycle less than about 50% and said anodic pulses have a duty cycle greater than about 50%, the charge transfer ratio of the cathodic pulses to the anodic pulses is greater than one, and the frequency of said pulses ranges from about 10 Hertz to about 5000 Hertz.

44 Claims, 5 Drawing Sheets

ELECTRODEPOSITION OF METALS IN SMALL RECESSES FOR MANUFACTURE OF HIGH DENSITY INTERCONNECTS USING REVERSE PULSE PLATING

BACKGROUND OF THE INVENTION

1. Field of the Invention

This invention relates to electrodeposition of metals and more particularly to electrodeposition of metals into small recesses on the surface of a substrate.

2. Brief Description of the Prior Art

In the manufacture of electronic equipment, development of technology and economics have driven the industry toward ever-smaller devices, containing ever-increasing numbers of components. At the level of semiconductor devices very large scale integration (VLSI) has produced chips containing up to a few million transistors on a single semiconductor chip no larger than several millimeters on a side. Such chips have conventionally been packaged or encapsulated in small modules having external lead wires for interconnecting the chips. The interconnections have conventionally been provided by circuit boards having electrical conductors prepared by so called "printed wiring" techniques that involve masking, etching, and plating of conductive metal, usually copper, to provide the interconnects between chip modules or sockets designed to hold such modules. These "printed wiring boards" (PWB) have typically been used to interconnect chips of conventional sizes. The chips or socket are mounted on the surface of the board with terminals fitted into holes through the board. The holes are typically lined with a thin layer of copper that is integral with the traces of copper on the surface of the board. The terminals of the chips or sockets are soldered to the copper layer lining the holes and thereby interconnected through the copper traces. The PWBs may have more than one layer of copper traces. Connections between traces in different layers are also provided by copper-lined holes passing through the board, commonly known as plated through-holes (PTHs)

The copper lining in such holes is typically applied electrolytically, by first laying down a thin layer of electroless copper to provide electrical continuity and then electroplating copper to a thickness of a few mils to provide the connecting layer. The holes in the PWBs typically are at least 12–13 mils in diameter. Because of the well-known problem of depositing metal electrolytically in recesses, special techniques have to be used to assure that a uniform layer of conductive metal is deposited in the holes. Consequently conventional techniques to enhance the "throwing power" of the electroplating system have been employed, such as agitation of the bath, addition of certain chemical compounds to the electroplating bath, and/or the use of pulsed current plating.

Although conventional techniques have generally been successful in the manufacture of PWBs having the dimensions that have been commonly used in electronic devices such as television receivers, personal computers, and the like, the trend to ever-smaller equipment such as cellular telephones, more advanced computers, and the like, has led to the necessity of mounting chips closer together in multichip modules (MCMs). Instead of terminals extending into holes in the circuit board, such MCMs frequently have only metallized locations on a major surface of the module to provide interconnections. The semiconductor devices or chips are placed relatively close together on a substrate having holes drilled therein at the locations of the interconnecting pads on the modules. In such boards the holes are typically of smaller diameter than those of conventional PWBs, and may range from about 25 micrometers (1 mil) to about 250 micrometers (10 mils). Such holes are also effectively blind holes, because the semiconductor devices are already mounted to the board, and the conductor deposition step provides the electrical contact to the terminal pads on the semiconductor devices as well as the interconnections between the devices. The use of small chips mounted close together and interconnected by means of conductors deposited in small holes has come to be known as high density interconnect (HDI) technology.

Deposition of conductive metal into the small, blind holes or vias used in HDI has presented a number of problems. Conventional metallization procedures, such as chemical vapor deposition or physical vapor deposition, are slow and expensive. Electroplating into small blind holes using conventional procedures has not been able to provide a reliable layer of conductive metal in the hole to assure a reliable interconnection of the chips. In particular, conventional electroplating techniques tend to deposit excess metal at the sharp corners at the top or entrance of the hole. Such deposits encroach on the opening of the hole and hinder deposition in the lower portion of the hole. They may even completely block the mouth of the hole leading to voids in the vias or interconnects. Furthermore, chemical additives in the plating bath may lead to inclusions of impurities derived from the plating bath within the metal deposit. Such problems can lead to connections that have a high electrical resistance and are mechanically brittle and unreliable in service. In addition, the use of nonconventional electroplating techniques such as pulse current plating, typically in conjunction with chemical additives, has relied on waveform parameters successfully developed for traditional PWB applications, such as 13 mil and greater PTHs. These waveforms generally operate with long cathodic duty cycles and short anodic duty cycles. This approach has led to similar problems encountered in conventional plating with excess metal deposit at the opening of the via leading to voids in the interconnect or to excessive deposit of metal on the surface of the substrate. In addition to the problems cited above, such nonuniform metallization within the via or between the via and the substrate results in excessive processing time and cost associated with the excess metal.

Accordingly, a need has continued to exist for a method of depositing metallic conductors, especially copper, into the blind holes used in high density interconnects for multichip modules and the like.

SUMMARY OF THE INVENTION

The problems encountered in electrodeposition of continuous conductive layers of metals into small blind holes and vias have now been alleviated by the method of this invention, wherein a metal is selectively deposited on a substrate to provide a coating that lines or fills small blind holes and/or recesses without excessive deposition of metal at or near convex portions of the substrate surface such as protuberances and edges. The selective deposition is accomplished by a process in which an electrically conductive substrate having a blind hole or recess with at least one transverse dimension not greater than about 350 micrometers and preferably in a range of from about micrometers to about 350 micrometers is immersed in an electroplating bath containing ions of the metal to be deposited in said recess, and provided with a suitable counterelectrode, a modulated reversing electric current is passed between the electrodes through the plating bath, which may or may not contain chemical additives to enhance throwing power, having pulses that are cathodic with respect to the substrate and pulses that are anodic with respect to the substrate, the cathodic pulses having a short duty cycle and the anodic pulses having a long duty cycle, the charge transfer ratio of the cathodic pulses to the anodic pulses being greater than one, and the frequency of the pulses ranging from about 10 Hertz to about 5 kilohertz.

Accordingly, it is an object of the invention to provide an electrochemical method for depositing a metal in small blind holes in a substrate.

A further object is to provide a method for selective electrodeposition of a metal on a substrate having small recesses on its surface.

A further object is to provide a method for depositing metal from an electrolytic bath onto a substrate having recesses therein in order to provide reliable electrical connection between the surface of the substrate and the bottom portion of the recess.

A further object is to provide a method for forming a void-free deposit of metal in a small recess on the surface of a substrate.

A further object is to provide a method for electrodepositing metal into a small recess on the surface of a substrate without excessive deposition of metal on the surface of the substrate.

Further objects of the invention will become apparent from the description of the invention which follows.

DETAILED DESCRIPTION OF THE INVENTION AND PREFERRED EMBODIMENTS

The distribution of metal electrodeposited on an electrically conductive substrate is determined by the local variations in the electrical current density. The primary current distribution in an electroplating cell is determined by the geometry of the electrodes. Typically, the primary current density is inversely proportional to the distance between the cathode and the anode along the path that the current follows between the electrodes.

When a voltage is first applied to the electroplating cell, the metal ions in solution in contact with the cathode are deposited on the cathode and the concentration of the ions in the adjacent solution decreases. Consequently, a concentration gradient is established near the cathode, and metal ions accordingly diffuse from the bulk solution region of relatively high concentration toward the depleted region adjacent to the cathode. This layer of depleted and variable metal ion concentration is the Nernst diffusion layer. In direct-current (DC) electroplating, the Nernst diffusion layer will rapidly reach a steady-state thickness that is determined by the current density and the degree of agitation of the bath which produces a relative motion of the bulk electrolyte with respect to the electrode ($\delta_{N,DC}$ in FIGS. 2A, 2B and 2C). The more vigorous the agitation of the electrolyte in the plating bath, the thinner the Nernst diffusion layer will be. However, even for very vigorous relative motion between the bulk electrolyte and the electrode, e.g., with use of a rotating disk electrode, the thickness of the Nernst diffusion layer will still amount to several micrometers.

Figure 2A:
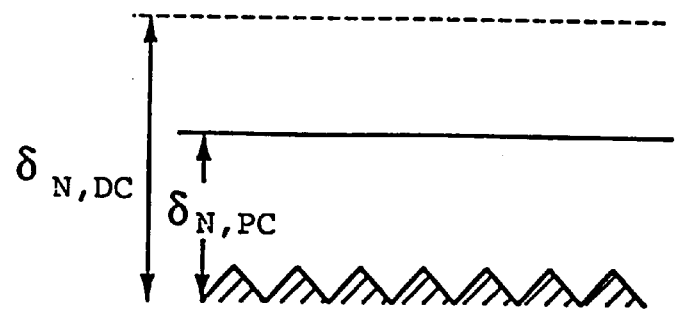
FIG. 2A illustrates the thickness of the Nernst diffusion layer with respect to the surface roughness of an electroplating substrate having a microrough surface.
Figure 2B:
FIG. 2B illustrates the thickness of the Nernst diffusion layer with respect to the surface roughness of an electroplating substrate having a macrorough surface.

The substrate surface will not, in general, be perfectly smooth. If the roughness of the surface, i.e., the size of the peaks and valleys therein, is large compared with the thickness $\delta_{N,DC}$ of the Nernst diffusion layer (a "macrorough" surface), the layer will tend to follow the surface asperities, as shown in FIG. 2B. Under these circumstances the electric field which determines the primary current distribution will be greater at the tips of the asperities than in the valleys. Accordingly, electrochemical reduction, i.e., deposition of metal, will take place preferentially at the peaks. The current flow in the electrolyte will establish a somewhat greater overpotential in the depressions of a macrorough surface than at the peaks, which will tend to provide a secondary current distribution that still favors metal deposition at the peaks, although perhaps not as much as the primary current distribution.

FIG. 2B indicates that, on a macrorough surface, the Nernst diffusion layer follows the contour of the surface asperities. Accordingly, the distribution of electrodeposited metal is not greatly affected by microvariations in current distribution caused by microasperities, as is the case for microrough substrates, as illustrated in FIG. 2A and discussed below. Therefore the thickness of the metal deposit on the peaks and valleys of a macrorough surface is determined essentially by the primary and secondary current distribution.

In conventional electroplating of industrial objects, the dimensions of any surface features are large with respect to the thickness of the Nernst diffusion layer. This relationship extends even to relatively small articles such as printed circuit boards, where the smallest features, e.g., throughholes, typically have dimensions of the order of 10–15 mils.

In electroplating of substrates having surface features significantly smaller than the Nernst diffusion layer, such as semiconductor wafers, the diffusion layer when plating is conducted using direct current (DC) not follow the microscopic peaks and valleys of the surface, as illustrated in FIG. 2A. For such "microrough" surfaces, the current distribution will also favor the deposition of metal at the peaks of the asperities, once the diffusion layer is established, because the concentration of metal ions, as determined by their rate of diffusion from the bulk phase, will tend to be slightly greater at the peaks. Such a current distribution is generally referred to as the tertiary current distribution.

Figure 2C:
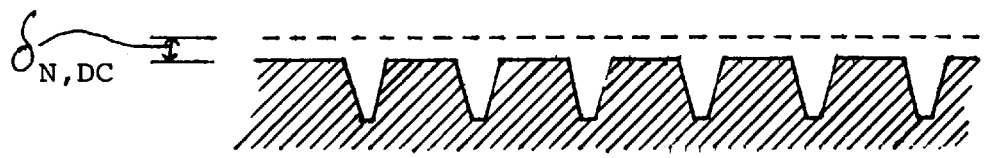
FIG. 2C illustrates the thickness of the Nernst diffusion layer with respect to a substrate having small recesses having transverse dimensions of about 5 micrometers to about 350 micrometers and aspect ratios of from about 0.5 to about 5.

When the substrate has a relatively smooth surface with trenches or holes therein having a transverse dimension in the range of from about 5 micrometers to about 350 micrometers, the relationship of the Nernst diffusion layer to the surface profile is more complex, and predictions regarding the behavior of the electrochemical deposit are more difficult. Such a surface is illustrated in FIG. 2C. Because the transverse dimension of the recesses, e.g., the diameter of a hole, are similar in magnitude to the thickness of the Nernst diffusion layer under the conventional conditions of agitation of the plating bath and DC plating, the entire interior of the recess is hydrodynamically inaccessible and within the diffusion layer. Evidently, the diffusion distance for transport of metal ions into the recess is substantially greater than for the transport of metal ions through the thinner diffusion layer adjacent to the surface. Under these circumstances predictions regarding the best conditions for producing a good deposit of metal within the recess are difficult.

The process of the invention is useful in providing plated metal layers on the surface of substrates having small recesses having a transverse dimension, i.e., a dimension generally in the plane of the surface, of 350 micrometers or less. The recesses may be holes with a generally circular cross section having a diameter of 350 micrometers or less, depressions of elliptical, square, rectangular, irregular cross section, or the like, wherein at least one transverse dimension is not substantially greater than about 350 micrometers, or elongated trenches or the like, having a width not substantially greater than about 350 micrometers. The process is especially useful in depositing metal layers on surfaces having recesses with at least one transverse dimension in the range of from about 5 micrometers to about 350 micrometers, preferably from about 10 micrometers to about 250 micrometers, more preferably from about 25 micrometers to about 250 micrometers, and still more preferably from about 50 micrometers to about 150 micrometers.

In DC electroplating it is conventional to counteract the tendency of the metal to be deposited preferentially at the peaks of the surface asperities by adding certain chemicals to the plating bath to improve its "throwing power." These additives help to produce a level coating of the metal. However, experience with such additives has been generally confined to electroplating onto macrorough substrates, and their mode of operation is not entirely understood. The additives are used in small amounts, and different applications have typically used different formulations. Consequently, the effectiveness of such additives for producing a uniform deposit of metal in small recesses cannot be predicted, and it would be expected that development of additives suitable for enhancing throwing power under these conditions would require extensive experimentation. Furthermore, because very small concentrations of additives are used, the measurement and control or replenishment of the additive concentration presents substantial difficulties. Finally, the additives may be occluded within the metal deposit. Such inclusions may cause increased resistance and quality control problems. The use of conventional plating bath additives is not excluded in the process of the invention, but it is preferred to minimize their use to avoid the problems indicated above.

Improved control of the plating deposit over that achievable using with DC plating and conventional plating bath additives is possible because it is also possible to control the deposition of metal by using a modulated electric field. As explained in U.S. Pat. No. 5,599,437, to Taylor et al., the entire disclosure of which is incorporated herein by reference, the use of a pulsed electric field, which produces a corresponding pulsed current through the electroplating cell, causes a more uniform deposition of metal over the entire surface of a microrough substrate. In general, the shorter the cathodic pulse, the more uniform the electrodeposition will be, because the concentration of metal ions immediately adjacent all portions of the substrate surface will more closely approach the initial bulk concentration in the electrolyte. This increased uniformity of electrolyte concentration is related to the thinner average thickness of the Nernst diffusion layer when a pulsed current is used ($\delta_{N,PC}$ in FIGS. 2A, 2B and 2C). The longer the pulse duration, the thicker will be the Nernst diffusion layer, and the more the current distribution and the corresponding distribution of plated metal will approach the current and metal deposition pattern characteristic of direct-current plating.

In the case of the macrorough surface (FIG. 2B) the thinner pulsed-current (PC) diffusion layer is not qualitatively different from the diffusion layer produced by DC electrolysis; both generally conform to the asperities of the substrate surface. Under such conditions, as suggested by Ibl (Ibl, N., 1981, in Proceedings of the Second International Pulse Plating Symposium, American Electroplaters and Surface Finishers Society (AESP), Winter Park, Fla.), the primary current distribution will prevail and the plating will in general be less uniform than for DC plating. However, for the microrough surface, the Nernst diffusion layer becomes relatively thicker with respect to the microasperities as the pulses become longer. Accordingly, the metal distribution will become more like that produced by direct-current plating, i.e., preferential deposition of metal on the peaks, or convex portions, of the microscopic asperities.

Conversely, if a microrough metal surface having small recesses is made the anode in an electrolysis cell using direct current, the tertiary current distribution will favor removal of metal from the surface over removal of metal from the small recesses in the surface. In this case also, short pulses tend to remove metal uniformly from the surface. However, longer anodic pulses will tend to approach the non-uniform metal removal observed with direct current electrolysis.

According to the invention, a substrate having a relatively smooth surface with small recesses therein, having a transverse dimension in the range of from about 5 micrometers to about 350 micrometers, can be electroplated with a layer of metal that follows the contours of the surface and recesses or fills the recesses without excessive deposition of metal on the surface of the substrate by using a modulated electric field in which cathodic and anodic pulses are applied successively. Relatively short cathodic pulses are applied to favor uniform deposition of metal over the exterior surface of the substrate and the interior surface of the recesses. The relatively short cathodic pulses are followed by relatively long anodic pulses, which favor removal of metal preferentially from the surface. Preferably the relatively long anodic pulses are interspersed frequently between the relatively short cathodic pulses, and may even alternate with the short cathodic pulses.

Under such PC conditions, with a surface profile as shown in FIG. 2C, the extent to which the Nernst diffusion layer conforms to the surface profile is difficult to predict. Accordingly, the Nernst diffusion layer for PC is not indicated in FIG. 2C. However, short cathodic pulses tend to reduce the thickness of the Nernst diffusion layer, as discussed above. Therefore, short cathodic pulses can, in principle, cause the diffusion layer to follow the surface profile closely, whereby the deposition of metal is still controlled by the tertiary current distribution, which favors uniform deposition of metal over the entire surface of the substrate including the small recesses.

Figure 1:
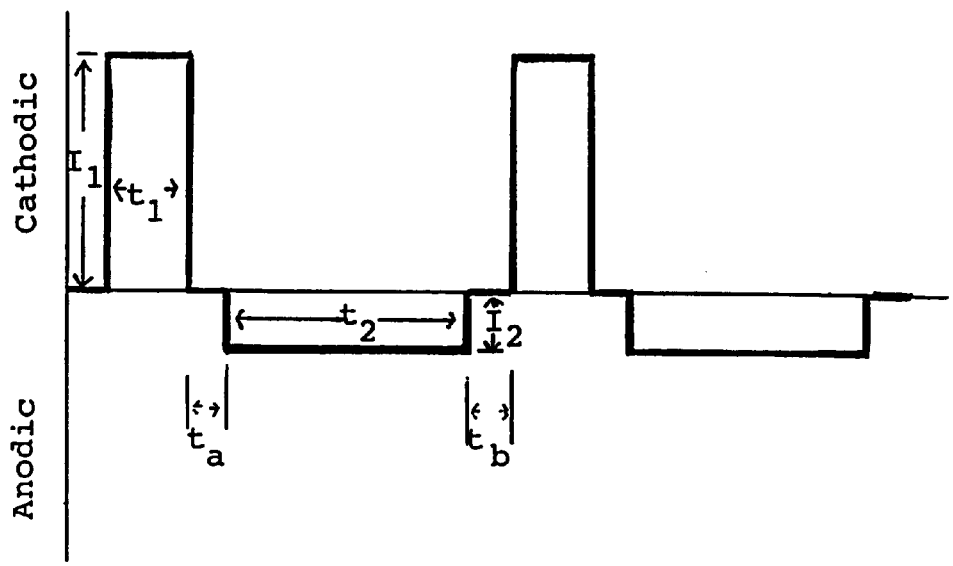
FIG. 1 illustrates the waveform of modulated reverse electric current used in the method of the invention.

A schematic representation of a rectangular modulated reverse electric field waveform used in the process of the invention is illustrated in FIG. 1. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in FIG. 1 could represent either current or voltage. Although it is generally more convenient in practice to control the voltage, the technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In FIG. 1, the cathodic peak current is shown as $I_1$ and the cathodic on-time is $t_1$. Similarly, the anodic peak current is shown as $I_2$ and the anodic on-time is $t_2$. The relaxation time, or off-times are indicated by $t_a$, and $t_b$. The sum of the cathodic on-time, anodic on-time, and off-times (if present) is the period T of the pulse train ($T=t_1+t_2+t_a+t_b$), and the inverse of the period of the pulse train (1/T) is the frequency ($f$) of the pulse train. The ratio of the cathodic on-time to the period ($t_1/T$) is the cathodic duty cycle ($D_1$), and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($I_1T_1$), while the anodic charge transfer density ($Q_2$) is the product of the anodic current density and the anodic on-time ($I_2T_2$). The average current density ($I_{ave}$) is the average cathodic current density ($D_1I_1$) minus the average anodic current density ($I_2D_2$). Accordingly the relationships among the parameters may be represented by the following equations.

$$T = \frac{1}{f} = t_1 + t_2 + t_a + t_b \quad (1)$$

$$D_1 = \frac{t_1}{T} \quad (2)$$

$$D_2 = \frac{t_2}{T} \quad (3)$$

$$\frac{Q_1}{Q_2} = \frac{i_1 t_1}{i_2 t_2} \quad (4)$$

$$I_{ave} = I_1 D_1 - I_2 D_2 \quad (5)$$

$$D_1 + D \leq 1 \quad (6)$$

According to the invention the cathodic duty cycle should be relatively short, less than about 50%, and the cathodic pulses should be relatively short, to favor uniform deposition of metal on both the concave (trenches) and convex (peaks) portions of the substrate surface. Preferably, the cathodic duty cycle is from about 30% to about 1%, more preferably from about 30% to about 15% and still more preferably from about 30% to about 20%.

Conversely, the anodic duty cycle should be relatively long, greater than about 50%, and the anodic pulses should be relatively long in order to favor removal of excess metal from the convex and peak portions of the substrate surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current) will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling or uniformly coating the trenches or blind vias required for high density interconnects provide great advantages in the manufacturing process.

The frequency of the pulse train used in the method of the invention may range from about 10 Hertz to about 5000 Hertz, preferably from about 100 Hz to about 3000 Hz and more preferably from about 500 Hz to about 1500 Hz. Accordingly, the cathodic and anodic pulse widths may vary from about 1.0 microsecond to about 100 milliseconds. Generally, as the feature size decreases or the aspect ratio increases, higher frequencies and or lower cathodic duty cycles are preferred. An anodic pulse is introduced between at least some of the cathodic pulses. However, it is not excluded that two or more cathodic pulses may be introduced between a pair of anodic pulses. In particular, a plurality of very short cathodic pulses may be followed by one relatively long anodic pulse. Accordingly, a number of cathodic and anodic pulses with defined pulse widths may make up one group of pulses, which is then repeated. Typically such a group would include one or more cathodic pulses and at least one anodic pulse. The period of a pulse train comprised of such pulse groups may conveniently be defined as the time from the beginning of one cathodic pulse to the beginning of the next cathodic pulse that is similarly situated in the pulse train. The frequency of the pulse train may then be defined as the reciprocal of the period, as discussed above.

The pulse width, duty cycle, and applied voltage of the cathodic and anodic pulses must be adjusted to provide that the overall process is cathodic, i.e., there is a net deposition of metal on the substrate workpiece. The practitioner will adapt the pulse width, duty cycle, and frequency to a particular application, based on the principles and teachings of the process of the invention.

Figure 3A:
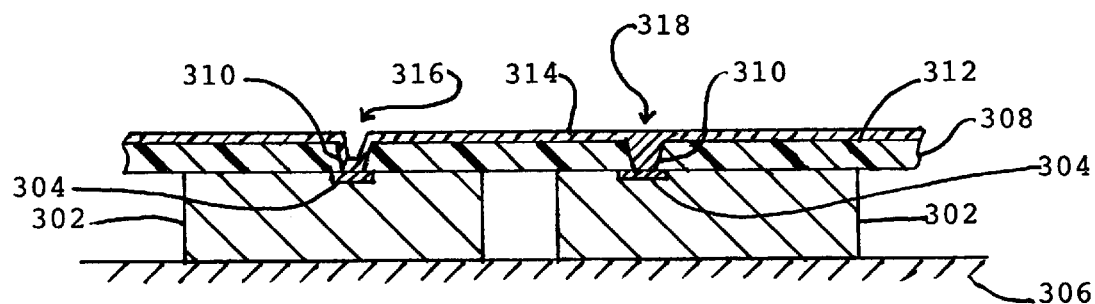
FIG. 3A illustrates a schematic cross-section of a multichip module showing the connection of one module to another through a vias prepared by the process of the invention.

The application of the filled recesses and vias prepared by the method of the invention to the high density interconnects in multichip modules is illustrated schematically in FIG. 3. Integrated circuit chips 302 shown schematically with one of the many connecting pads 304 illustrated, are supported on a conventional support, e.g. a ceramic base 306. A layer of a dielectric 308 is deposited on the upper surface of the chips 302. Small apertures or vias 310 are formed in the dielectric layer 308 by any conventional procedure, e.g., by laser ablation. In order to provide an electrically conducting substrate for the electroplating step a very thin layer (not shown) of a metal, e.g., copper, is deposited over the entire upper surface 312 of the dielectric layer 308 by conventional procedures, e.g. sputtering, physical vapor deposition, or chemical vapor deposition. The assembly is then immersed in a conventional electroplating bath for copper or other metal to be deposited on the dielectric layer 308, together with a counterelectrode. A modulated reversing electric field is impressed on the electrodes having a waveform that provides a relatively short pulse cathodic with respect to the substrate dielectric layer and a relatively long anodic pulse, as discussed above. The electric current driven by the modulated reverse electric field causes the deposition of the metal from the plating bath onto the surface of the dielectric to form a continuous layer of metal 314 over the surface 312 of the dielectric 308 and within the vias 310. The modulated reverse electric field having a waveform according to the invention tends to favor deposition of the metal in the vias 310, thereby assuring a good coating of metal in the vias 310 while avoiding an excess deposition of metal on the upper surface 312 of the dielectric layer 308. The plating is continued until the metal, e.g., copper, has reached a thickness suitable for providing high density interconnects between the semiconductor chips. If the plating is conducted for a relatively short time, the metal layer will follow the contour of the surface and interior walls and bottom of the vias to form a conformal via, as shown at 316. If the plating is continued for a longer period, the vias can be completely filled with metal to form a solid, or stud, via which can form the base for a stacked via in a subsequently formed interconnect layer, as shown at 318. Both conformal and stud vias are shown in FIG. 3 for illustrative purposes, although ordinarily only one type will be formed in a given plating step.

Figure 3B:
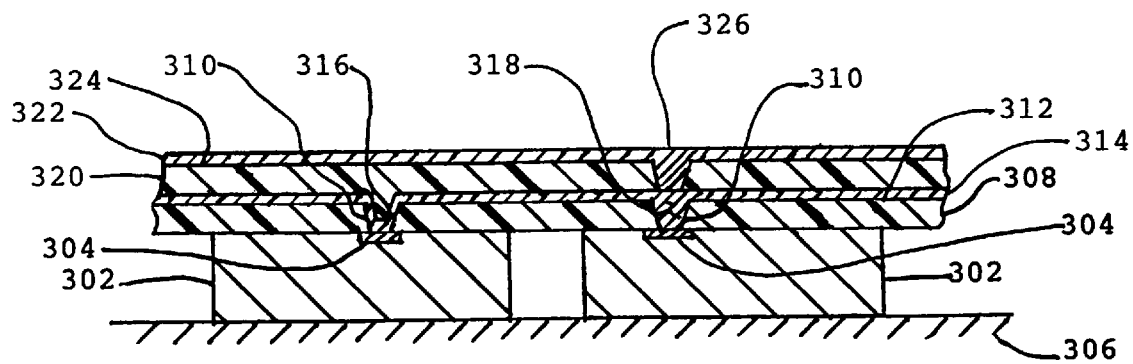
FIG. 3B illustrates a schematic cross-section of a multichip module having a more than one interconnect layer, showing the formation of stacked vias prepared by the process of the invention.

Because the process of the invention permits the easy preparation of solid, or stud, vias in a single plating step, it is useful in preparing stacked vias in multichip modules having multiple interconnect layers. Such a module is illustrated schematically in FIG. 3B, wherein a second dielectric layer 320 has been deposited on the module of FIG. 3A, and a second layer of metal 322 has been electroplated on the upper surface 324 of dielectric layer 320. The module of FIG. 3B illustrates a via 326 positioned directly above the solid via 318 in the first dielectric layer 308, to provide a direct interconnect to the surface of dielectric layer 320 or to a subsequently deposited interconnect layer.

The application of the method of the invention to filling a recess in a substrate surface is illustrated in the following examples. In the following examples copper was plated onto a brass substrate having small recesses in its surface using electric fields having several different waveforms. Electrically conducting substrates were prepared by cutting brass coupons about 19 mm (0.75 inch) square and drilling therein one or more recesses having a circular cross section of about 4 mils (102 micrometers) using small twist drill. The holes were drilled to a depth of about 150–200 micrometers, providing recesses having an aspect ratio of about 1.5:1 to 2:1.

The coupons were mounted horizontally on the lower end of a rotating electrode, which was immersed in a plating bath. The counterelectrode was a copper plate.

The plating bath comprised an aqueous solution containing 55 g/L of copper sulfate, 9% of sulfuric acid by weight, 50 parts per million (ppm) of chloride ion, and 5% by weight of a conventional polyethylene glycol carrier compound.

The electrodeposition was conducted using a number of different electric field conditions of the prior art as well as the modulated reversed electric field of the invention.

EXAMPLE 1

This example illustrates electrodeposition of copper on a brass substrate having a small recess using direct current.

Figure 4:
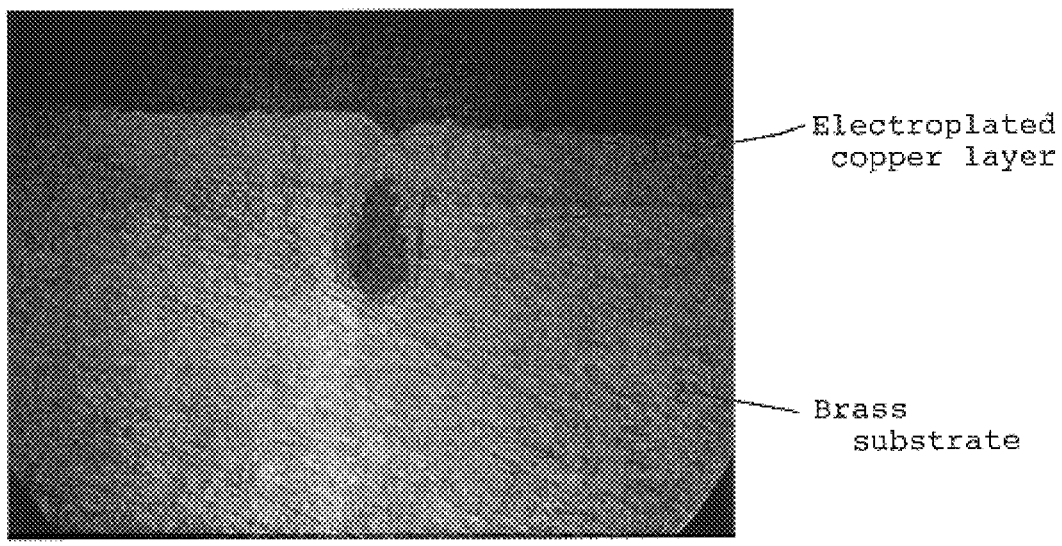
FIG. 4 is a photomicrograph of a cross section of a 102 micrometer diameter hole in a brass substrate plated with copper using direct current.

Copper was deposited on a brass coupon having a drilled hole with a diameter of about 102 micrometers using direct current at a current density of 35 mA/cm$^2$ for a period of 4 hours. The coupon was then sectioned through the hole to reveal a cross section of the copper plating on the surface of the coupon and within the recess. A photomicrograph of the plating under direct current condition is shown in FIG. 4. It is evident that relatively little copper was deposited in the recess. The plating on the surface is substantially thicker than that within the recess, and the nonuniform distribution at the upper corners of the recess has resulted in a bridge over the mouth of the recess and a substantial volume within the recess that is devoid of deposited copper. Evidently such a distribution of plated copper does not provide a reliable interconnection between the conductive copper layer on the surface and the bottom of the recess.

EXAMPLE 2

This example illustrates electrodeposition of copper on a brass substrate having a small recess using pulsed current provided by a modulated electric field.

Copper was deposited on a brass coupon having a drilled hole with a diameter of about 102 micrometers using pulsed current. The pulsed current comprised cathodic pulses separated by periods of no current. The period (T) of the pulse train was 0.293 ms (frequency 3413 Hz), and the duration of the cathodic pulse was 0.043 ms, giving a cathodic duty cycle $D_c$ of 14.7%. The average current $I_{ave}$ was 35 mA/cm$^2$ and the peak current density was 242 mA/cm$^2$. The plating was conducted for a period of 4 hours.

Figure 5:
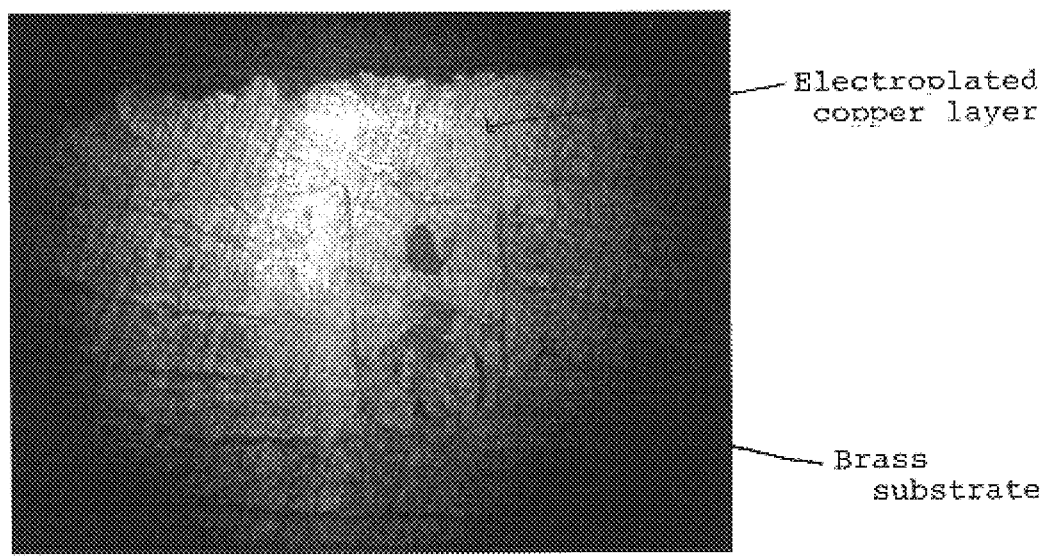
FIG. 5 is a photomicrograph of a cross section of a 102 micrometer diameter hole in a brass substrate plated with copper using pulsed current.

The coupon was then sectioned and photographed as in Example 1. A photomicrograph of the plating under pulsed current conditions is shown in FIG. 5. Although the pulsed current plating deposited more copper within the recess than the direct current plating, the deposit within the recess contains numerous voids, and the thickness of the deposit on the surface of the coupon is relatively thick. Such a distribution of plated copper is undesirable for providing a reliable, low-resistance interconnection between the conductive copper layer on the surface and the bottom of the recess.

EXAMPLE 3

This example illustrates electrodeposition of copper on a brass substrate having a small recess using modulated reverse electric field, of relatively low frequency, having a relatively long cathodic duty cycle and a relatively short anodic duty cycle. Such a waveform is representative of the modulated reverse electric fields that have been used in some processes for plating through-holes in printed circuit boards.

Copper was deposited on a brass coupon having a drilled hole with a diameter of about 102 micrometers using a modulated reverse electric field. The waveform comprised alternating cathodic and anodic pulses. The period T of the pulse train was 10.2 ms (frequency 98.13 Hz)the cathodic on-time $t_c$ was 9.2 ms and the anodic on-time was 1 ms, resulting in a cathodic duty cycle Dc of 90.2% and an anodic duty cycle of 9.8%. The ratio of cathodic current to anodic current ($I_c/I_a$) was 0.5 and the ratio of cathodic charge transfer to anodic charge transfer $Q_c/Q_a$ was 5. The average current density was 32.3 mA/cm$^2$ (30 A/ft$^2$). The plating was conducted for a period of 3 hours.

Figure 6:
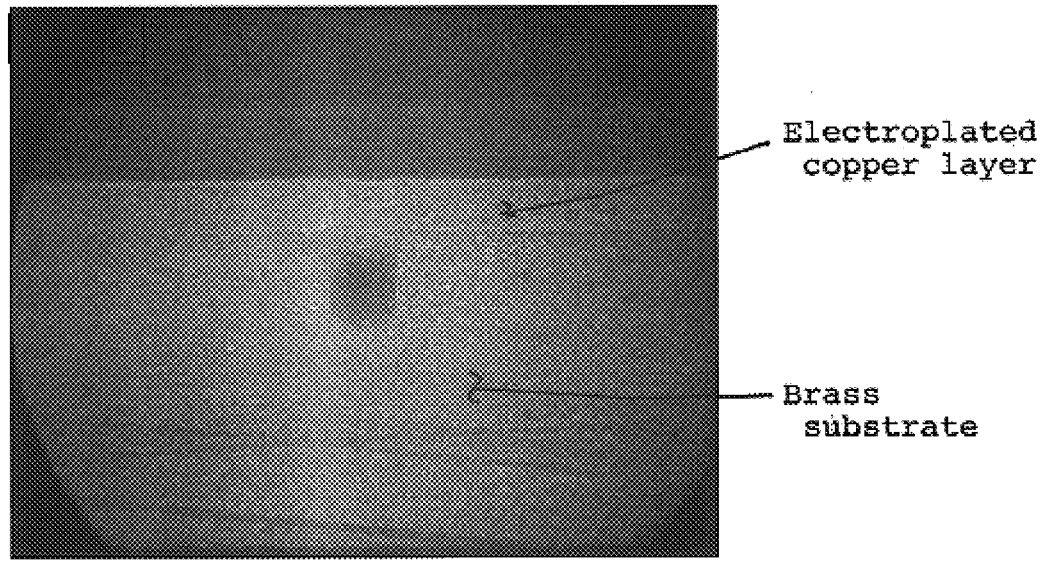
FIG. 6 is a photomicrograph of a cross section of a 102 micrometer diameter hole in a brass substrate plated with copper using modulated reverse electric fields at a relatively low frequency of 98.13 Hz with a long cathodic duty cycle and a short anodic duty cycle.

The coupon was then sectioned and photographed as in Example 1. A photomicrograph of the plating achieved with this waveform is shown in FIG. 6. The modulated reverse electric field waveform having a long cathodic duty cycle and short anodic duty cycle produced a copper deposit that was confined almost exclusively to the surface. very little copper was deposited in the recess leaving a large void volume within the recess and little or no copper deposit on the lower sides and bottom of the recess.

Evidently such a distribution of plated copper does not provide a reliable interconnection between the conductive copper layer on the surface and the bottom of the recess.

EXAMPLE 4

This example illustrates electrodeposition of copper on a brass substrate having a small recess using modulated reverse electric field having a relatively long cathodic duty cycle and a relatively short anodic duty cycle at a higher frequency than in Example 3. Such a waveform is representative of the modulated reverse electric fields that have been used in some processes for plating through-holes in printed circuit boards, but the frequency is substantially higher than that used in the conventional modulated reverse electric field plating methods.

Copper was deposited on a brass coupon having a drilled hole with a diameter of about 102 micrometers using a modulated reverse electric field. The waveform comprised alternating cathodic and anodic pulses. The period T of the pulse train was 0.382 ms (frequency 2617 Hz), the cathodic on-time $t_c$ was 0.054 ms, and the anodic on-time was 0.054 ms, resulting in a cathodic duty cycle $D_c$ of 86% and an anodic duty cycle $D_a$ of 14%. The ratio of cathodic current to anodic current ($I_c/I_a$) was 0.5 and the ratio of cathodic charge transfer to anodic charge transfer $Q_c/Q_a$ was 3. The average current density was 32.3 mA/cm$^2$ (30 A/ft$^2$). The plating was conducted for a period of 3 hours.

Figure 7:
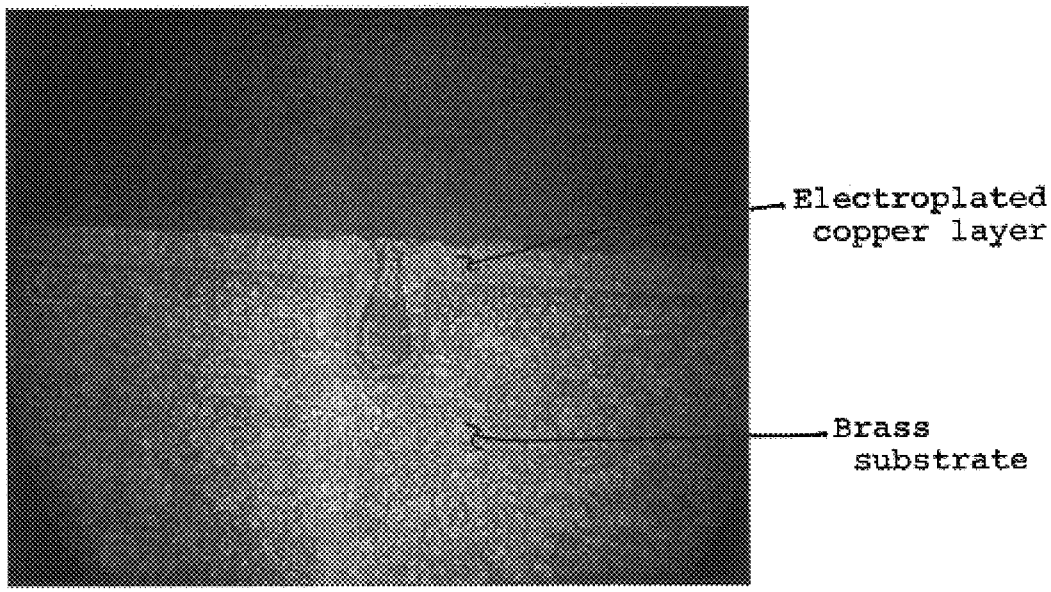
FIG. 7 is a photomicrograph of a cross section of a 102 micrometer diameter hole in a brass substrate plated with copper using modulated reverse electric fields at a relatively high frequency of 2618 Hz with a long cathodic duty cycle and a short anodic duty cycle.

The coupon was then sectioned and photographed as in Example 1. A photomicrograph of the plating achieved with this waveform is shown in FIG. 7. The high-frequency modulated reverse electric field waveform having a long cathodic duty cycle and short anodic duty cycle produced a copper deposit that was superior to that produced by the very similar low-frequency waveform. However, the thickness of the copper deposit in the lower portion of the recess was substantially thinner than that on the surface of the coupon, and the plating was nonuniform at the mouth of the recess.

Although copper deposit of this example shows a continuous film of copper over the surface of the coupon and into the recess, the film exhibits excessive thickness on the surface of the coupon, and the nonuniform plating at the mouth of the recess suggests the possibility of trapping impurities in the cavity.

EXAMPLES 5 and 6

This example illustrates electrodeposition of copper on a brass substrate having a small recess using modulated reverse electric field according to the invention. The waveform exhibits a relatively short cathodic duty cycle and a relatively long anodic duty cycle.

Copper was deposited on a brass coupon having a drilled hole with a diameter of about 102 micrometers using a modulated reverse electric field. The waveform comprised alternating cathodic and anodic pulses. The period T of the pulse train was 0.293 ms (frequency 3413 Hz), the cathodic on-time $t_c$ was 0.043 ms, and the anodic on-time was 0.25 ms, resulting in a cathodic duty cycle $D_c$ of 14.7% and an anodic duty cycle $D_a$ of 85.3%. The peak cathodic current density $I_{cpk}$ was 277 mA/cm$^2$, and the peak anodic current density $I_{apk}$ was 42 ma/cm$^2$, resulting in a ratio of cathodic charge transfer to anodic charge transfer $Q_c/Q_a$ of 1.2. The average current density was 15 mA/cm$^2$ (13.9 A/ft$^2$). In Example 5, the plating was conducted for a period of 2 hours; in Example 6 the plating was conducted for a period of 4 hours.

Figure 8:
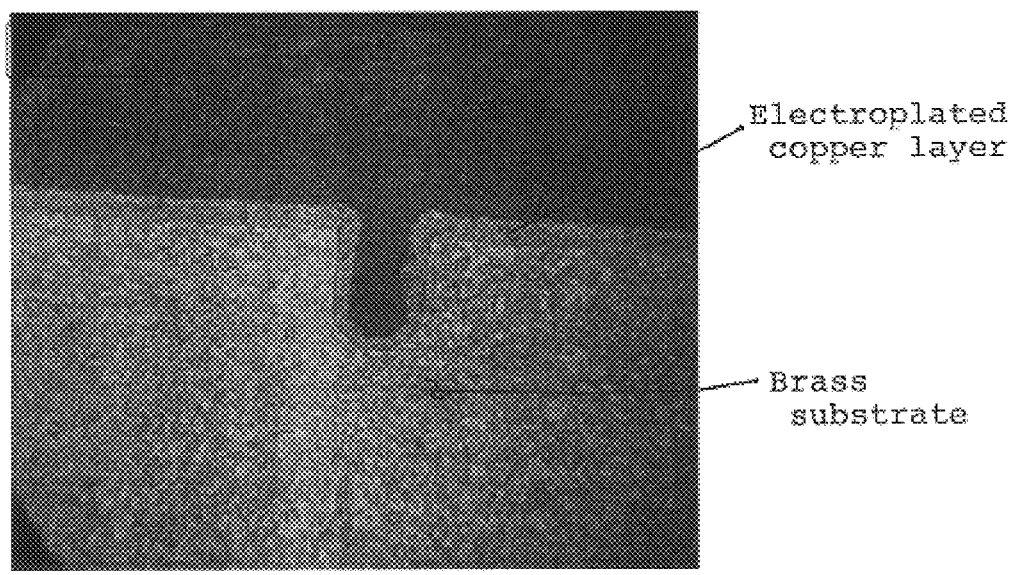
FIG. 8 is a photomicrograph of a cross section of a 102 micrometer diameter hole in a brass substrate plated with copper using modulated reverse electric fields at a relatively high frequency of 3413 Hz with a short cathodic duty cycle and a long anodic duty cycle for a period of time to plate a thin continuous layer of copper over the surface of the substrate and the interior surface of the hole.
Figure 9:
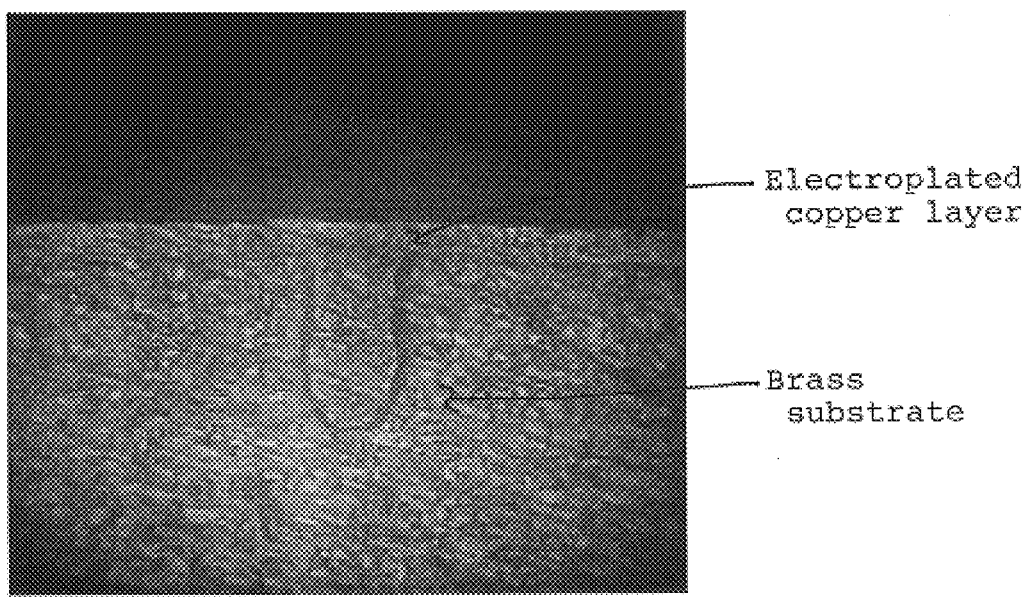
FIG. 9 is a photomicrograph of a cross section of a 102 micrometer diameter hole in a brass substrate plated with copper using modulated reverse electric fields at a relatively high frequency of 3413 Hz with a short cathodic duty cycle and a long anodic duty cycle for a period of time to plate a thin continuous layer of copper over the surface of the substrate and to fill the interior of the hole.

The coupons were then sectioned and photographed as in Example 1. A photomicrograph of the plating of Example 5 is shown in FIG. 8; a photomicrograph of the plating of Example 6 is shown in FIG. 9.

In Example 5 (2 hours plating)the copper deposit was relatively uniform over the surface of the coupon and the sides and bottom of the recess. Evidently, such a layer of electrodeposited copper is suitable for providing a reliable electrical connection between a device located at the bottom of a recess and a conductive strip on the surface of the substrate.

In Example 6 (4 hours plating) the copper deposit on the surface of the coupon is still relatively thin. However, the entire recess has been filled with electroplated copper. Accordingly, the process of the invention is capable of producing vias or blind recesses that are filled with copper (stud vias) while avoiding excess deposition of copper on the surface of the substrate.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a continuous layer of a metal onto a substrate having small recesses in its surface comprising immersing an electrically conductive substrate having a generally smooth surface having at least one small recess therein, wherein at least one transverse dimension of said recess is from about 5 micrometers to about 250 micrometers, in an electroplating bath containing ions of a metal to be deposited onto said surface, immersing a counter electrode in said plating bath passing an electric current between said substrate and said counterelectrode, wherein said electric current is a modulated reversing electric current comprising a train of pulses that are cathodic with respect to said substrate and pulses that are anodic with respect to said substrate, said cathodic pulses have a duty cycle less than about 50% and said anodic pulses have a duty cycle greater than about 50%, the charge transfer ratio of said cathodic pulses to said anodic pulses is greater than one, and the frequency of said pulse train ranges from about 10 Hertz to about 5000 Hertz.

2. The method of claim 1 wherein an interval of no electric current flow is interposed between said cathodic pulses and succeeding anodic pulses.

3. The method of claim 1 wherein an interval of no electric current flow is interposed between said anodic pulses and succeeding cathodic pulses.

4. The method of claim 1 wherein an interval of no electric current flow is interposed between said cathodic pulses and succeeding anodic pulses and between said anodic pulses and succeeding cathodic pulses.

5. The method of claim 1 wherein said cathodic pulses and said anodic pulses succeed each other without intervening intervals of no electric current flow.

6. The method of claim 1 wherein said cathodic pulses and said anodic pulses form a pulse train having a frequency between about 50 Hertz and about 5000 Hertz.

7. The method of claim 1 wherein said cathodic pulses and said anodic pulses form a pulse train having a frequency between about 100 Hertz and about 3000 Hertz.

8. The method of claim 1 wherein said cathodic pulses and said anodic pulses form a pulse train having a frequency between about 500 Hertz and about 1500 Hertz.

9. The method of claim 1 wherein said cathodic pulses have a duty cycle of from about 30% to about 1%.

10. The method of claim 1 wherein said cathodic pulses have a duty cycle of from about 30% to about 15%.

11. The method of claim 1 wherein said cathodic pulses have a duty cycle of from about 30% to about 20%.

12. The method of claim 1 wherein said anodic pulses have a duty cycle of from about 60% to about 99%.

13. The method of claim 1 wherein said anodic pulses have a duty cycle of from about 70% to about 85%.

14. The method of claim 1 wherein said cathodic pulses have a duty cycle of from about 70% to about 80%.

15. The method of claim 1 wherein said metal is selected from the group consisting of copper, silver, gold, zinc, chromium, nickel, bronze, brass, and alloys thereof.

16. The method of claim 1 wherein a layer of metal of substantially uniform thickness is deposited on said surface and within said recesses.

17. The method of claim 1 wherein the thickness of the metal layer deposited within said recesses is greater than the thickness of the metal layer deposited on said surface.

18. The method of claim 1 wherein said recesses are substantially filled with metal.

19. The method of claim 1 wherein at least one transverse dimension of said recess is from about 25 micrometers to about 250 micrometers.

20. The method of claim 1 wherein at least one transverse dimension of said recess is from about 50 micrometers to about 150 micrometers.

21. The method of claim 1 wherein amounts of conventional plating bath additives that are used in small amounts are minimized in said plating bath.

22. The method of claim 21 wherein said plating bath is essentially devoid of said conventional plating bath additives that are used in small amounts.

23. The method of claim 1 wherein additives in said plating bath that help to produce a level coating of metal are minimized.

24. The method of claim 1 wherein said plating is essentially devoid of additives that help to produce a level coating of metal.

25. The method of claim 1 wherein said metal is copper.

26. The method of claim 25 wherein amounts of conventional plating bath additives that are used in small amounts are minimized in said plating bath.

27. The method of claim 25 wherein said plating bath is essentially devoid of said conventional plating bath additives that are used in small amounts.

28. The method of claim 27 wherein at least one of said small recesses is filled in a single plating step.

29. The method of claim 25 wherein additives in said plating bath that help to produce a level coating of metal are minimized.

30. The method of claim 25 wherein said plating bath is essentially devoid of additives that help to produce a level coating of metal.

31. The method of claim 30 wherein at least one of said small recesses is filled in a single plating step.

32. The method of claim 25 wherein said plating bath contains conventional amounts of copper ions, sulfuric acid, chloride ions, and a conventional polyethylene glycol carrier compound.

33. The method of claim 25 wherein said plating bath consists essentially of an aqueous solution containing conventional amounts of copper ions, sulfuric acid, chloride ions, and a conventional polyethylene glycol carrier compound.

34. The method of claim 33 wherein at least one of said small recesses is filled in a single plating step.

35. The method of claim 25 wherein said plating bath consists of an aqueous solution containing conventional amounts of copper ions, sulfuric acid, chloride ions, and a conventional polyethylene glycol carrier compound.

36. The method of claim 25 wherein said plating bath contains about 55 g/L of copper sulfate, about 9% by weight of sulfuric acid, about 50 parts per million of chloride ions and about 5% by weight of a conventional polyethylene glycol carrier compound.

37. A method for filling a small recess in a surface of an electrically conducting substrate with a void-free deposit of metal comprising immersing an electrically conductive substrate having a generally smooth surface having at least one small recess therein, wherein at least one transverse dimension of said recess is from about 5 micrometers to about 250 micrometers, in an electroplating bath containing ions of a metal to be deposited onto said surface, immersing a counter electrode in said plating bath, passing an electric current essentially continuously between said substrate and said counterelectrode for a period of time until said recess has been filled with said metal, wherein
said electric current is a modulated reversing electric current comprising a train of pulses that are cathodic with respect to said substrate and pulses that are anodic with respect to said substrate,
said cathodic pulses have a duty cycle less than about 50% and said anodic pulses have a duty cycle greater than about 50%,
the charge transfer ratio of said cathodic pulses to said anodic pulses is greater than one, and
the frequency of said pulse train ranges from about 10 Hertz to about 5000 Hertz.

38. The method of claim 37 wherein said plating bath is essentially devoid of additives that help to produce a level coating of metal.

39. The method of claim 37 wherein said passage of electric current is terminated promptly when said recess has been filled with said metal.

40. The method of claim 37 wherein said metal is copper.

41. A method for electrodeposition of metal in a small recess in a surface of a substrate while minimizing deposition of metal on the surface of said substrate comprising
immersing an electrically conductive substrate having a generally smooth surface having at least one small recess therein, wherein at least one transverse dimension of said recess is from about 5 micrometers to about 250 micrometers, in an electroplating bath containing ions of a metal to be deposited onto said surface,
immersing a counter electrode in said plating bath,
preferentially depositing metal in said recess by
passing an electric current between said substrate and said counterelectrode for a period of time until said recess has been filled with said metal,
wherein
said electric current is a modulated reversing electric current comprising a train of pulses that are cathodic with respect to said substrate and pulses that are anodic with respect to said substrate,
said cathodic pulses have a duty cycle less than about 50% and said anodic pulses have a duty cycle greater than about 50%,
the charge transfer ratio of said cathodic pulses to said anodic pulses is greater than one, and
the frequency of said pulse train ranges from about 10 Hertz to about 5000 Hertz.

42. The method of claim 41 wherein said plating bath is substantially devoid of additives that help to produce a level coating of metal.

43. The method of claim 41 wherein said metal is copper.

44. The method of claim 41 wherein said passage of electric current is terminated promptly when said recess has been filled with said metal.

* * * * *